(12) United States Patent
Tseng et al.

(10) Patent No.: US 10,074,615 B1
(45) Date of Patent: Sep. 11, 2018

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Ying-Cheng Tseng, Tainan (TW); Chih-Hua Chen, Hsinchu County (TW); Hsiu-Jen Lin, Hsinchu County (TW); Hao-Yi Tsai, Hsinchu (TW); Kuo-Chung Yee, Taoyuan (TW); Chia-Hung Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/794,003

(22) Filed: Oct. 26, 2017

(51) Int. Cl.
*H01L 23/552* (2006.01)
*H01L 23/34* (2006.01)
*H01L 23/538* (2006.01)
*H01L 21/02* (2006.01)

(52) U.S. Cl.
CPC ........ *H01L 23/552* (2013.01); *H01L 21/0201* (2013.01); *H01L 21/02008* (2013.01); *H01L 23/34* (2013.01); *H01L 23/5384* (2013.01)

(58) Field of Classification Search
CPC ............. H01L 23/552; H01L 21/02008; H01L 21/0201; H01L 23/34; H01L 23/5384
See application file for complete search history.

(56) References Cited

U.S. PATENT DOCUMENTS

| | | | |
|---|---|---|---|
| 7,619,901 B2* | 11/2009 | Eichelberger | ....... H01L 21/6835 361/763 |
| 8,193,604 B2* | 6/2012 | Lin | ................... H01L 23/49816 257/379 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2017/0069828 A1* | 3/2017 | Lee | ....................... H01L 23/552 |

* cited by examiner

*Primary Examiner* — Karen Kusumakar
(74) *Attorney, Agent, or Firm* — JCIPRNET

(57) ABSTRACT

A package structure including at least one conductive plate, a redistribution layer, a first semiconductor chip, a conductive shielding structure and an insulating encapsulant is provided. The first semiconductor chip is sandwiched in between the at least one conductive plate and the redistribution layer, wherein the first semiconductor chip is disposed on the at least one conductive plate and electrically connected to the redistribution layer. The conductive shielding structure is sandwiched in between the at least one conductive plate and the redistribution layer, wherein the conductive shielding structure surrounds the first semiconductor chip and electrically connects the at least one conductive plate with the redistribution layer. The insulating encapsulant is disposed on the redistribution layer, encapsulating the first semiconductor chip, the conductive shielding structure, and surrounding the at least one conductive plate.

20 Claims, 15 Drawing Sheets

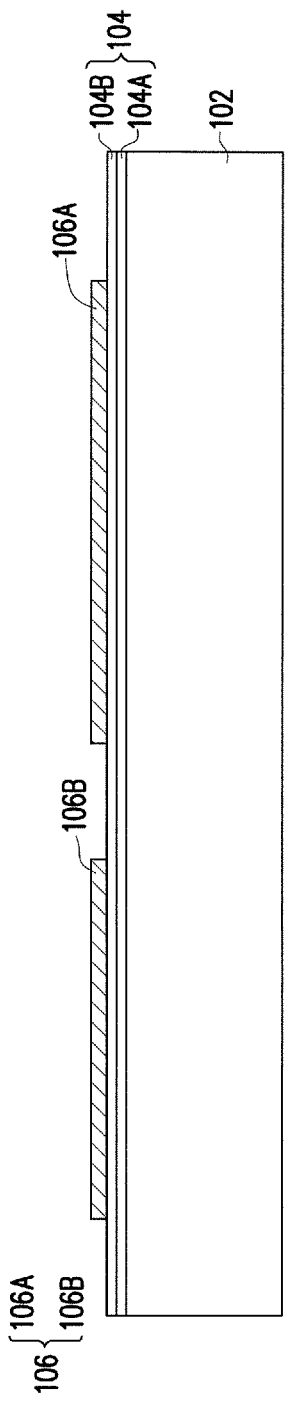
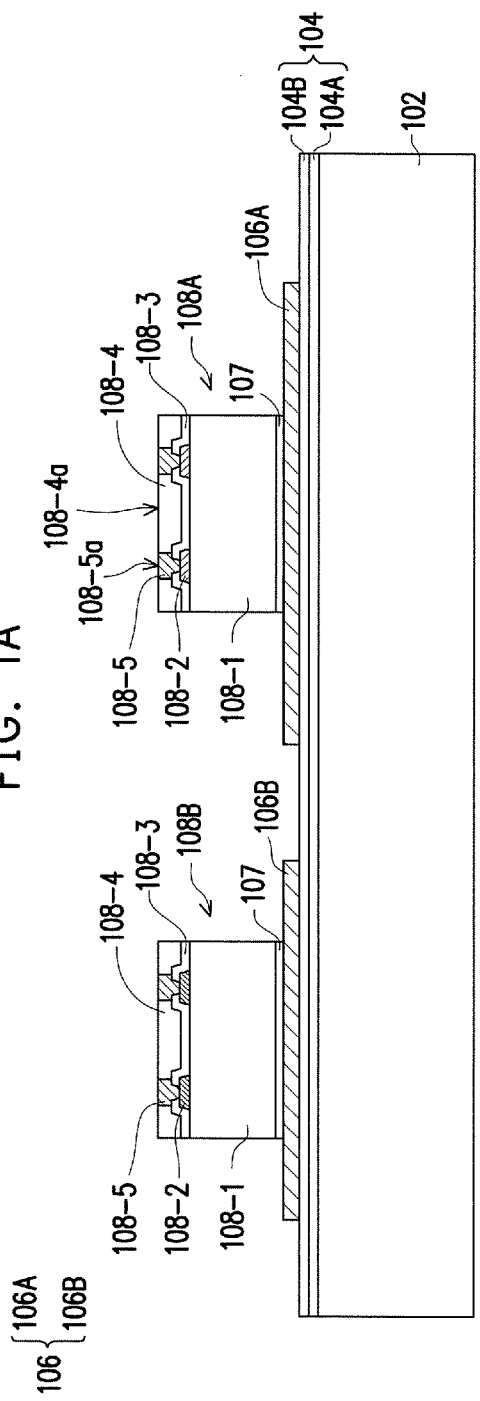
FIG. 1A
FIG. 1B

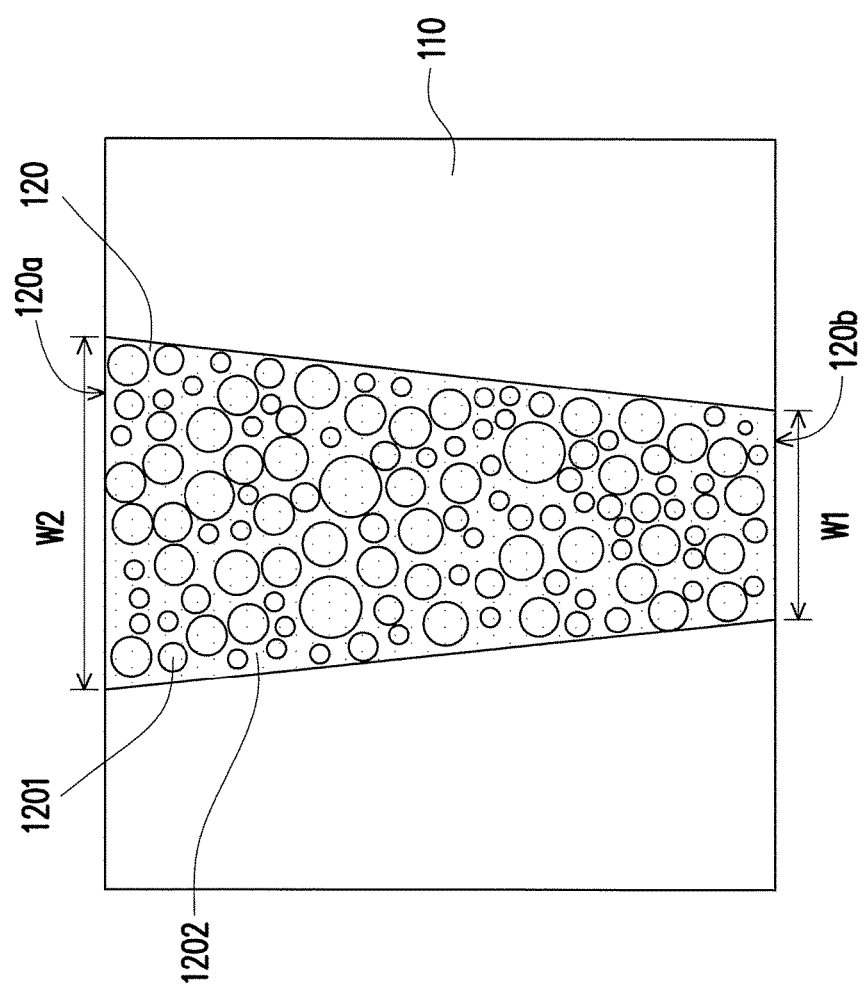

PACKAGE STRUCTURE AND METHOD OF FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging. Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1I are schematic sectional views of various stages in a method of fabricating a package structure according to some exemplary embodiments of the present disclosure.

DETAILED DESCRIPTION

Figure 1C:
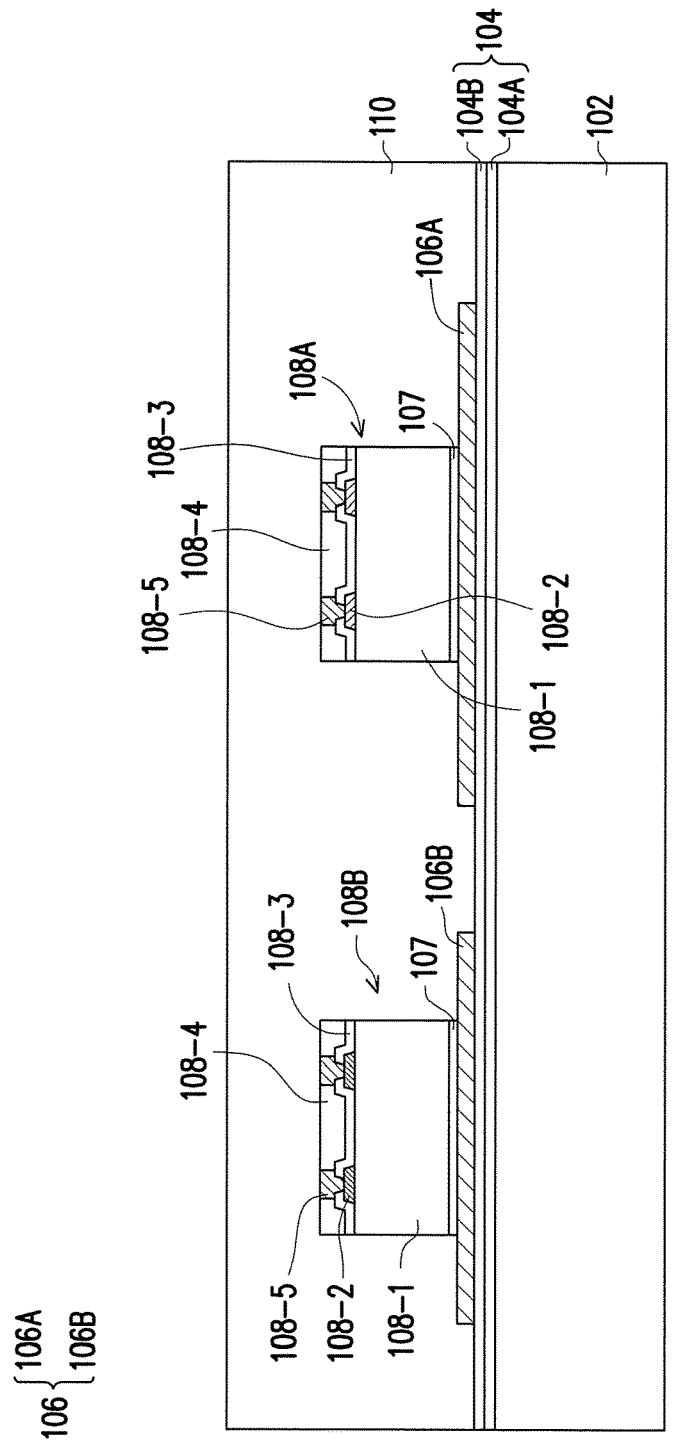

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic sectional views of various stages in a method of fabricating a package structure according to some exemplary embodiments of the present disclosure. As shown in FIG. 1A, a carrier 102 with a buffer layer 104 coated thereon is provided. The carrier 102 may be a glass carrier or any suitable carrier for carrying a semiconductor wafer or a reconstituted wafer used for the method of fabricating the package structure. In some embodiments, the buffer layer 104 includes, for example, a debonding layer 104A and a dielectric layer 104B. In certain embodiments, the debonding layer 104A is a light-to-heat conversion (LTHC) release layer, and such layer enables room temperature debonding from the carrier 102 by applying laser irradiation. Furthermore, in some embodiments, the dielectric layer 104B may be made of dielectric materials such as benzocyclobutene ("BCB"), polybenzoxazole ("PBO"), or any other suitable polymer-based dielectric material. However, the materials of the carrier 102, the debonding layer 104A and the dielectric layer 104B are not limited to the descriptions of the embodiments. In some alternative embodiments, the dielectric layer 104B may be omitted; in other words, merely the de-bonding layer 104A is formed over the carrier 102.

In addition, in the exemplary embodiment, a conductive pattern 106 is formed on the dielectric layer 104B and over the carrier 102. In the exemplary embodiment, if the dielectric layer 104B is omitted, the conductive pattern 106 is formed directly on the debonding layer 104A. In some embodiments, the conductive pattern 106 for example, includes a first conductive plate 106A and a second conductive plate 106B. In some embodiments, the first conductive plate 106A and the second conductive plate 106B are disposed on the top surface (on the same plane) of the dielectric layer 104B. In some embodiments, the first conductive plate 106A and the second conductive plate 106B are formed by depositing a metal material layer (not shown) and then patterning the metal material layer to form the conductive pattern 106. In some embodiments, the first conductive plate 106A and the second conductive plate 106B are formed by printing or lamination. In one embodiment, the first conductive plate 106A and the second conductive plate 106B are made of the same material. In alternative embodiments, the first conductive plate 106A and the second conductive plate 106B are formed from different materials. In certain embodiments, the first conductive plate 106A and the second conductive plate 106B are metal plates formed by metal materials such as copper, aluminum, alloys thereof or the like. In some embodiments, the first conductive plate 106A and the second conductive plate 106B may function as heatsinks. Furthermore, the outline/design of the conductive pattern 106 is not limited to the illustration shown in FIG. 1A, instead, the outline/design of the conductive pattern 106 may be adjusted based on the size of the chips/die formed in a subsequent step, and based on their requirement for connection.

Referring to FIG. 1B, in the exemplary embodiment, a first semiconductor chip 108A is disposed on the first conductive plate 106A, and a second semiconductor chip 108B is disposed on the second conductive plate 106B. The second semiconductor chip 108B is being disposed adjacent to the first semiconductor chip 108A. In some embodiment, the first semiconductor chip 108A and the second semiconductor chip 108B are for example, adhered to the first conductive plate 106A and the second conductive plate 106B through a conductive adhesive 107 respectively. In certain embodiments, the first semiconductor chip 108A and the second semiconductor chip 108B are different types of chips. In some embodiments, the first semiconductor chip 108A and the second semiconductor chip 108B are the same types of chips. In some embodiments, the first conductive plate 106A or the second conductive plate 106B includes a semiconductor substrate 108-1, a plurality of conductive pads 108-2, a passivation layer 108-3, a protection layer 108-4 and a plurality of conductive pillars 108-5. In one embodiment, the conductive pads 108-2 are formed on the semiconductor substrate 108-1, and the passivation layer 108-3 is formed over the semiconductor substrate 108-1 and has openings that partially expose the conductive pads 108-2. In some embodiments, the semiconductor substrate 108-1 is a silicon substrate including active components (e.g., transistors, diodes, optoelectronic devices or the like) and passive components (e.g., resistors, capacitors, inductors, transducers or the like) formed therein. In certain embodiments, the conductive pads 108-2 are aluminum pads, copper pads or other suitable metallic pads. In some embodiments, the passivation layer 108-3 includes a silicon oxide layer, a silicon nitride layer, a silicon oxy-nitride layer or a dielectric layer formed by other suitable dielectric materials.

Furthermore, in some embodiments, the conductive pillars 108-5 are formed on the exposed conductive pads 108-2 respectively, and the protection layer 108-4 is formed on the passivation layer 108-3 with the conductive pillars 108-5 exposed from the protection layer 108-4 for further electrical connection. In some embodiments, the conductive pillars 108-5 are copper pillars or copper alloy pillars. Furthermore, in some embodiments, the protection layer 108-4 includes a polymer layer having sufficient thickness to protect the conductive pillars 108-5. For example, in some embodiments, the protection layer 108-4 includes a polybenzoxazole (PBO) layer, a polyimide (PI) layer or layers of other suitable polymer materials. In the illustrated embodiment, the first semiconductor chip 108A is for example, a radio frequency chip, and the second semiconductor chip 108B is for example, an application processor chip or a base band chip. However, this construe no limitations in the embodiment. In some alternative embodiments, the first semiconductor chip 108A and the second semiconductor chip 108B may be the same or different, and may be adjusted based on design requirement.

Referring to FIG. 1C, after disposing the first semiconductor chip 108A and the second semiconductor chip 108B on the conductive plates (106A/106B), an insulating encapsulant 110 is formed on the carrier 102 to cover the conductive plates (106A/106B) and to encapsulate the first semiconductor chip 108A and the second semiconductor chip 108B. In some embodiments, the insulating encapsulant 110 is a molding compound that includes, for example, an epoxy resin or any other suitable type of molding materials. In some embodiments, the insulating encapsulant 110 fills the gaps between the first semiconductor chip 108A and the second semiconductor chip 108B and covers the first semiconductor chip 108A and the second semiconductor chip 108B respectively.

Figure 1D:
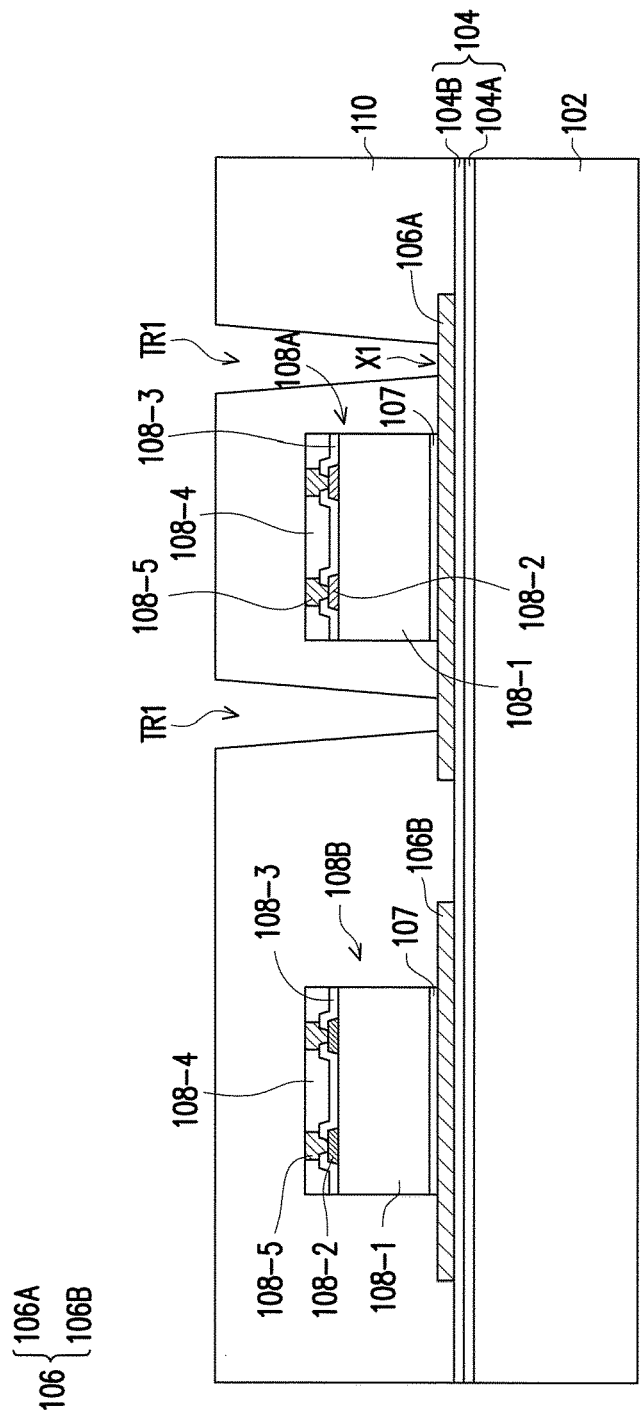

Referring to FIG. 1D, after forming the insulating encapsulant 110, a trench TR1 is formed within the insulating encapsulant 110, surrounding the first semiconductor chip 108A and exposing portions of the conductive plate 106A. That is, in some embodiments, portions of the insulating encapsulant 110 are removed to form the trench TR1, and the trench TR1 may be a continuous ring-shaped trench surrounding the first semiconductor chip 108A, but without exposing the first semiconductor chip 108A. In some embodiments, the trench TR1 is formed above the conductive plate 106A to partially expose the conductive plate 106A. In certain embodiments, the trench TR1 exposes a first surface X1 of the first conductive plate 106A. The first surface X1 is for example, the surface that the first semiconductor chip 108A is adhered to and is the surface of the first conductive plate 106A that is faces away from the carrier 102. In one embodiment, the first surface X1 is the top surface of the first conductive plate 106A as shown in FIG. 1D. In some embodiments, the trench TR1 is for example, formed by a laser drilling process. In some embodiments, the trench TR1 includes slant sidewalls and has a top opening wider than its bottom opening.

Figure 1E:
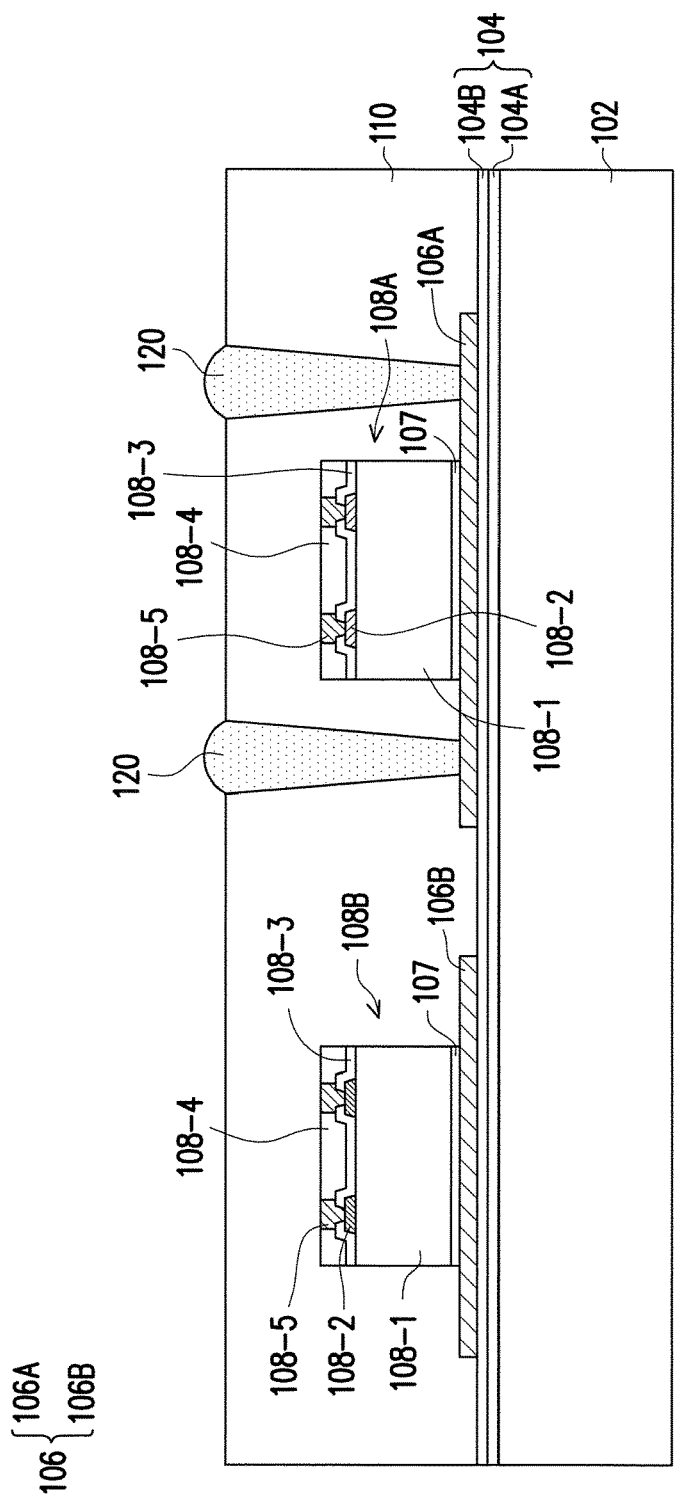

Subsequently, referring to FIG. 1E, a conductive shielding structure 120 is formed within the trench TR1. In some embodiments, the conductive shielding structure 120 is formed by filling the trench with a conductive paste (not shown) and curing the conductive paste to form the conductive shielding structure 120. In one embodiment, the curing is performed at a curing temperature of about 100° C. to about 250° C. In some embodiments, a material of the conductive paste includes a polymer material and conductive particles including copper particles and silver particles. After curing, as shown in FIG. 1G, the formed conductive shielding structure 120 is a metallic structure including aggregated conductive particles 1201 dispersed within the polymer material matrix 1202 (from microscopic view). In certain embodiments, the material of the conductive shielding structure 120 comprises silver and copper. In certain embodiments, the conductive shielding structure 120 for example, surrounds the first semiconductor chip 108A and is entirely located on the conductive plate 106A. In certain embodiments, the conductive shielding structure 120 is a solid and continuous ring-like structure that surrounds the first semiconductor chip 108A. The conductive shielding structure 120 may provide good electromagnetic interference (EMI) shielding capability to shield the electromagnetic interference or filter out the signal noise from the first semiconductor chip 108A.

Figure 1F:
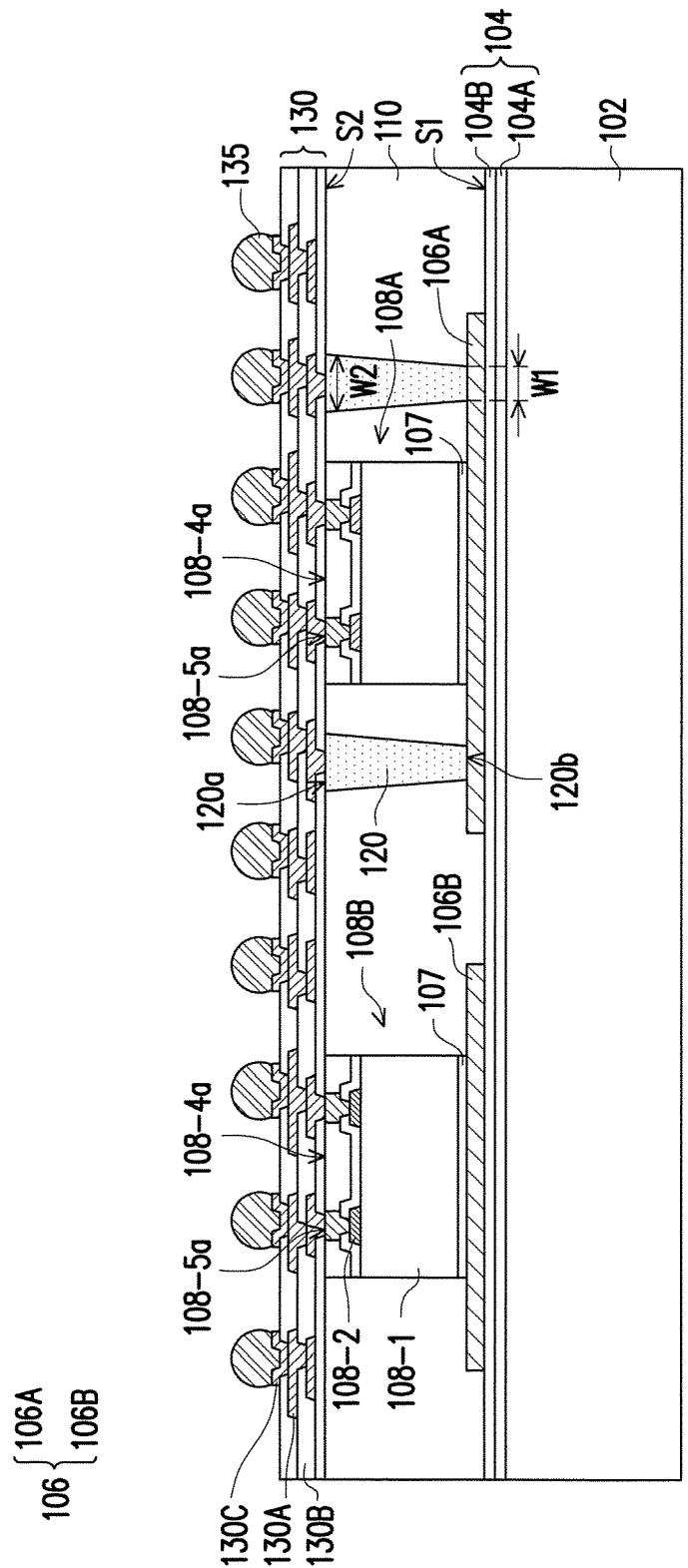

Referring to FIG. 1F, after forming the conductive shielding structure 120, the insulating encapsulant 110 is thinned until top surfaces of the first semiconductor chip 108A and the second semiconductor chip 108B are exposed and the conductive pillars 108-5 are exposed. For example, the top surface 108-4a of the protection layer 108-4 and the top surface 108-5a of the conductive pillars 108-5 of the semiconductor chips (108A/108B) are exposed from the insulating encapsulant 110 after the thinning process. In some embodiments, the insulating encapsulant 110 is thinned by a mechanical grinding process and/or chemical mechanical polishing (CMP) process, or a fly-cut process. After the thinning process, the insulating encapsulant 110 is formed to have a first surface S1 and a second surface S2. In some embodiments, the first surface S1 is facing the carrier 102, whereas the second surface S2 is facing away from the carrier 102. The second surface S2 of the insulating encapsulant 110, the top surface 120a of the conductive shielding structure 120, the top surface 108-4a of the protection layer 108-4 and the top surface 108-5a of the conductive pillars 108-5 may be coplanar with each other.

Furthermore, an enlarged view of the conductive shielding structure 120 obtained after the thinning process is illustrated in FIG. 1G. As shown in FIG. 1F and FIG. 1G, in some embodiments, a width of the conductive shielding structure 120 decreases from the top surface 120a to the bottom surface 120b. That is, in certain embodiments, the top surface 120a of the conductive shielding structure 120 may have a width W2 while the bottom surface 120b of the conductive shielding structure 120 may have a width W1, and the width W2 is greater than the width W1. In certain embodiments, a ratio of the width W1 to the width W2 is 3:5. However, the disclosure is not limited thereto. In alternative embodiments, the width W2 may be smaller than the width W1, or the width W2 may be substantially equal to the width W1. In certain embodiments, the conductive shielding structure 120 is formed with a width (W1/W2) in a range of 40 μm to 250 μm. In some embodiments, as more clearly shown in the enlarged view of FIG. 1G, the conductive shielding structure 120 is formed with microstructures having aggregated conductive particles 1201 (e.g. copper particles and/or silver particles) dispersed within the matrix 1202 (e.g. epoxy based materials).

Referring back to FIG. 1F, following the thinning processes, a redistribution layer 130 may be formed on the first semiconductor chip 108A, the second semiconductor chip 108B, the conductive shielding structure 120, and on the insulating encapsulant 110. In the exemplary embodiment, the redistribution layer 130 is formed on the second surface S2 of the insulating encapsulant 110 to cover the exposed top surfaces (120a/108-4a/108-5a) of the conductive shielding structure 120, the protection layer 108-4 and the conductive pillars 108-5 respectively. In some embodiments, the redistribution layer 130 includes a plurality of inter-dielectric layers 130B and a plurality of conductive layers 130A stacked alternately. Although only two layers of the conductive layers 130A and three layers of inter-dielectric layers 130B are illustrated herein, however, the scope of the disclose is not limited by the embodiments of the disclosure. In other embodiments, the number of conductive layers 130A and the inter-dielectric layers 130B may be adjusted based on product requirement. In some embodiments, the conductive layers 130A are electrically connected to the conductive pillars 108-5 of the first semiconductor chip 108A and the second semiconductor chip 108B respectively. After forming the redistribution layer 130, a plurality of conductive balls 135 may be placed on the redistribution layer 130. In some embodiments, the topmost inter-dielectric layers 130B of the redistribution layer 130 may include a plurality of conductive pads 130C. The conductive pads 130C are for example, under-ball metallurgy (UBM) patterns used for ball mount. In certain embodiments, the conductive balls 135 are placed on the conductive pads 130C through a ball placement process. In some embodiments, the conductive balls 135 are electrically connected to the first semiconductor chip 108A and the second semiconductor chip 108B through the conductive pads 130C and the conductive layers 130A of the redistribution layer 130.

Figure 1H:
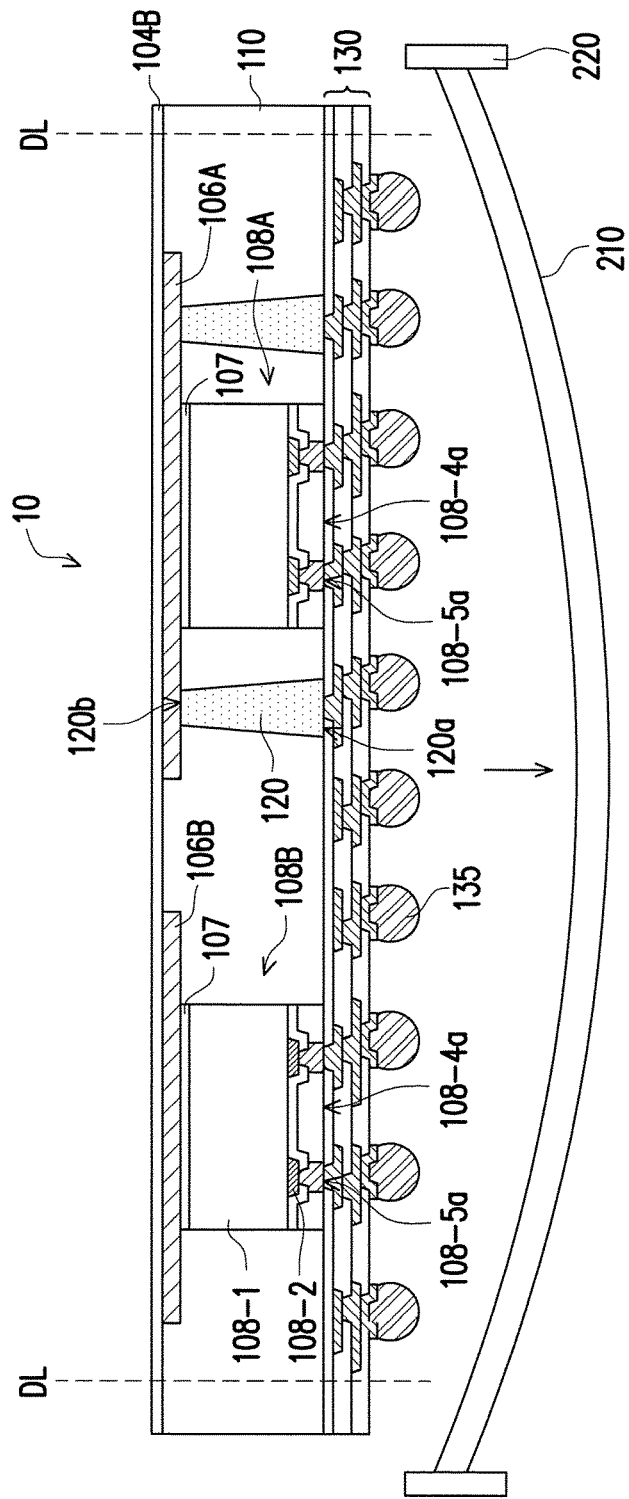
Figure 11:
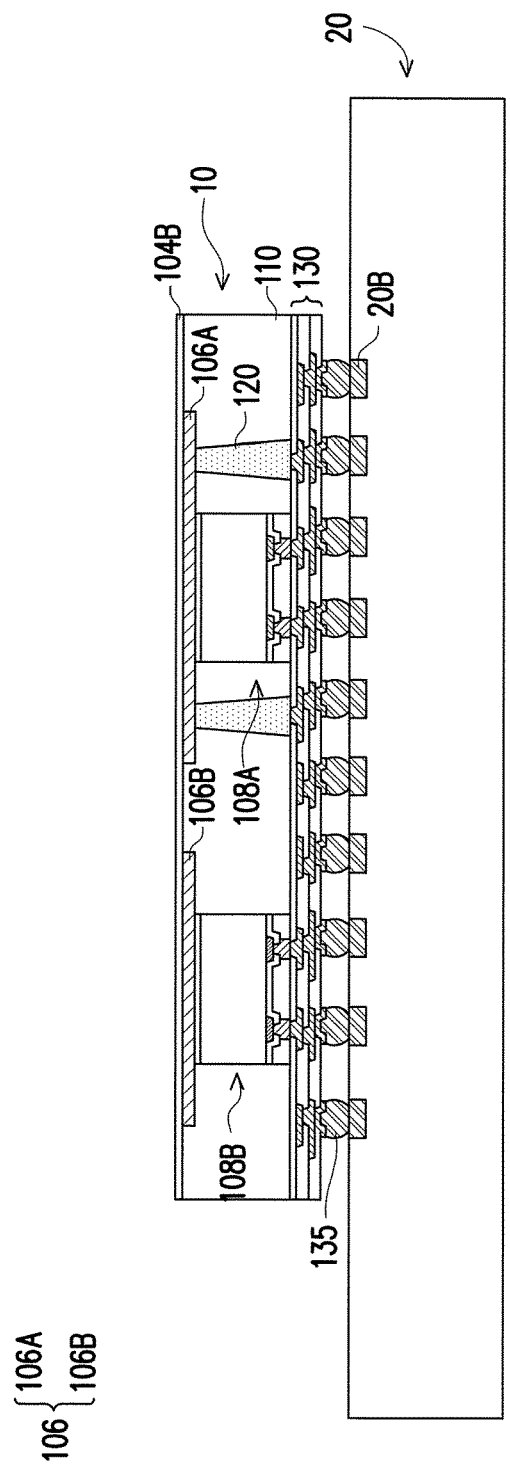

Referring to FIG. 1H, after forming the redistribution layer 130 and the conductive balls 135, the structure shown in FIG. 1F is turned upside down and attached to a tape 210 (e.g., a dicing tape 210) supported by a frame 220. As illustrated in FIG. 1H, the carrier 102 is debonded and is separated from the first semiconductor chip 108A, the second semiconductor chip 108B and the dielectric layer 104B. In accordance with some embodiments, the debonding process includes projecting a light such as a laser light or an UV light on the debonding layer 104A so that the carrier 102 can be easily removed along with the debonding layer 104A. In some embodiments, the dielectric layer 104B may be peeled from the carrier 102 by irradiating laser onto the debonding layer 104A (e.g., the LTHC release layer). In alternative embodiments, the dielectric layer 104B may be removed along with the debonding layer 104A and the carrier, so that the top surfaces of the insulating encapsulant 110 and the conductive plates 106A, 106B are exposed.

After debonding the carrier 102, a dicing process is performed along the dicing lines DL to cut the whole wafer structure (cutting through the dielectric layer 104B, the insulating encapsulant 110 and the redistribution layer 130) into a plurality of packages 10. In the exemplary embodiment, the dicing process is a wafer dicing process including mechanical blade sawing or laser cutting. Subsequently, the separated packages 10 may be disposed onto a circuit substrate 20 as illustrated in FIG. 1I. For example, the package 10 may be electrically connected to bonding pads 20B of the circuit substrate 20 through the plurality of conductive balls 135.

As shown in FIG. 1H and FIG. 1I, in the package 10 of the exemplary embodiment, the first semiconductor chip 108A is sandwiched in between the first conductive plate 106A and the redistribution layer 130, wherein the first semiconductor chip 108A is disposed on the first conductive plate 106A and electrically connected to the redistribution layer 130. The insulating encapsulant 110 encapsulates the first semiconductor chip 108A, and surrounds the first conductive plate 106A. Similarly, in some embodiments, the second semiconductor chip 108A is sandwiched in between the second conductive plate 106B and the redistribution layer 130, wherein the second semiconductor chip 108B is disposed adjacent to the first semiconductor chip 108A, and the insulating encapsulant 110 encapsulates the second semiconductor chip 108B and surrounds the second conductive plate 106B. In addition, in some embodiments, the conductive shielding structure 120 is sandwiched in between the first conductive plate 106A and the redistribution layer 130, wherein the conductive shielding structure 120 surrounds the first semiconductor chip 108A and electrically connects the first conductive plate 106A to the redistribution layer 130. The conductive shielding structure 120 may also be encapsulated by the insulating encapsulant 110.

Figure 2:
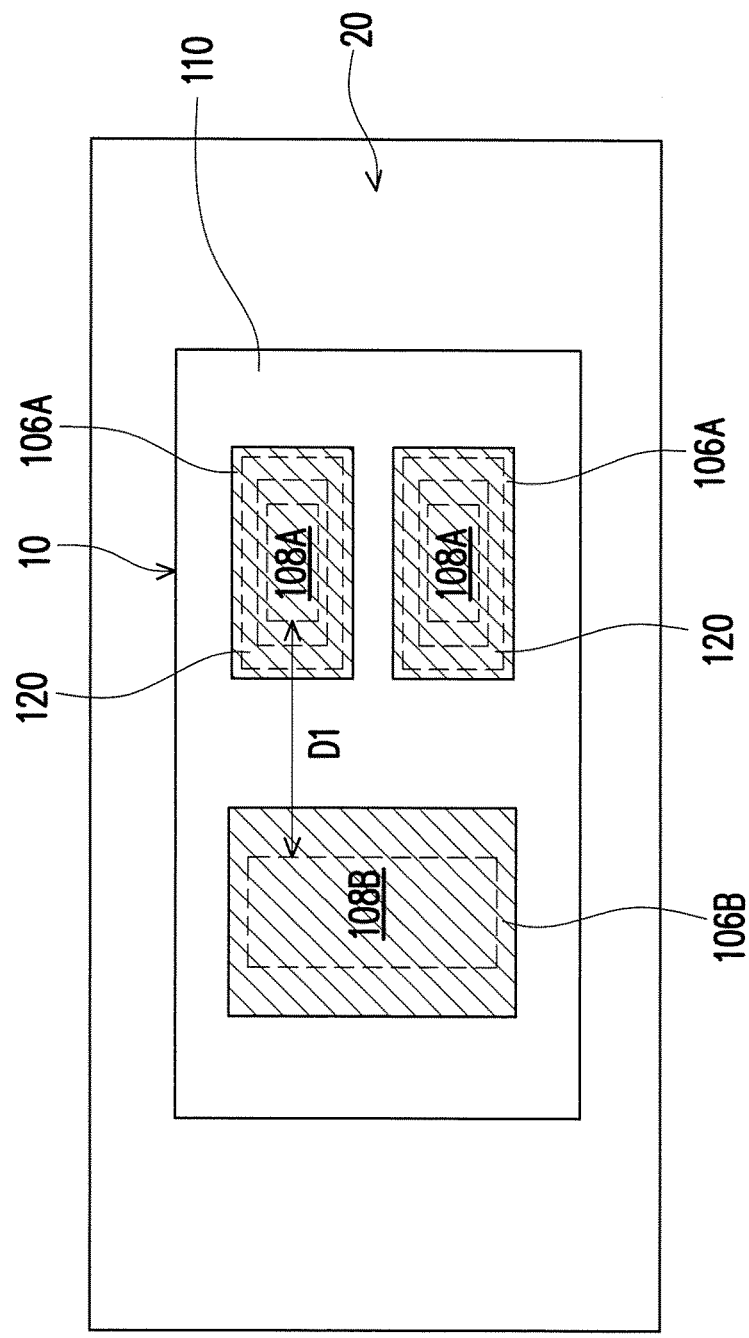
FIG. 2 is a schematic top view of a package structure according to some exemplary embodiments of the present disclosure.

FIG. 2 is a schematic top view of a package structure according to some exemplary embodiments of the present disclosure. FIG. 2 is for example, a top view of the package structure obtained in FIG. 1I. For explanation purposes, at least the dielectric layer 104B is omitted from FIG. 2.

Although two first semiconductor chips 108A and one second semiconductor chip 108B are illustrated, however, the disclosure is not limited thereto. In alternative embodiments, the number and types of semiconductor chip disposed in the package 10 may be adjusted based on product requirements. In the exemplary embodiment, the two first semiconductor chips 108A are for example, radio frequency chips. As more clearly observed from the top-view, each of the first semiconductor chips 108A is encircled by the conductive shielding structure 120. That is, the first semiconductor chips 108A are located within an area surrounded by the conductive shielding structure 120 and are fenced by the conductive shielding structure 120. The conductive shielding structure 120 encircling the first semiconductor chip 108A offers a high shielding capability for the first semiconductor chips 108A. As such, a distance D1 between the first semiconductor chip 108A (e.g. a radio frequency chip) and the second semiconductor chip 108B (e.g. an application processor chip/a base band chip) can be made closer as compared with conventional structures.

In the embodiments shown in FIG. 1A to FIG. 1I and FIG. 2, the conductive shielding structure 120 is arranged to surround the first semiconductor chips 108A but not to surround the second semiconductor chip 108B. However, the disclosure is not limited thereto. In alternative embodiments, depending on the type and location of the semiconductor chips used, the conductive shielding structures may be formed around more than one or all of the semiconductor chips (108A/108B) as required. Alternative embodiments where each of the semiconductor chips (108A/108B) is surrounded by a corresponding conductive shielding structure is shown in FIG. 3A to FIG. 3D.

Figure 3A:
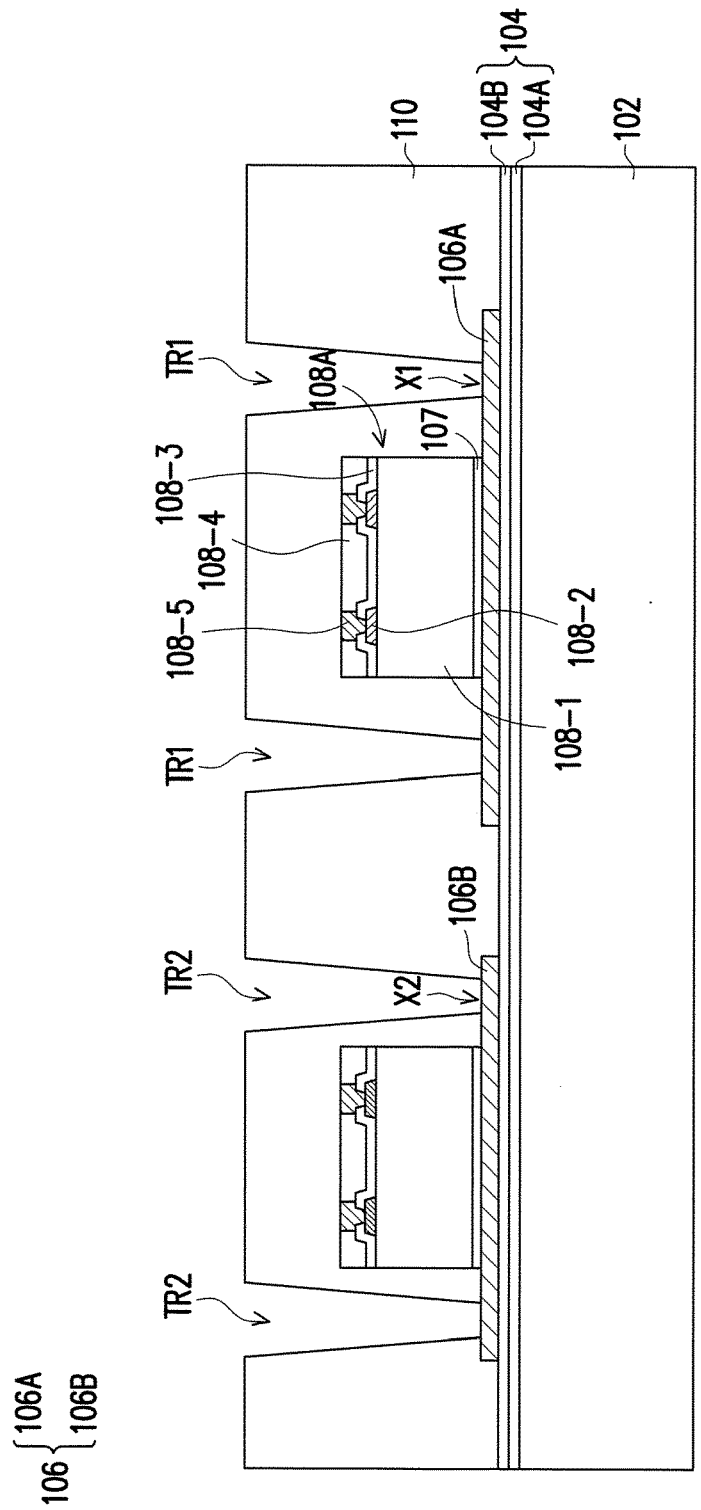
FIG. 3A to FIG. 3D are schematic sectional views of various stages in a method of fabricating a package structure according to some other exemplary embodiments of the present disclosure.

FIG. 3A to FIG. 3D are schematic sectional views of various stages in a method of fabricating a package structure according to some other exemplary embodiments of the present disclosure. The embodiments shown in FIG. 3A to FIG. 3D is similar to the embodiments shown in FIG. 1A to FIG. 1H, hence the same reference numerals are used to refer to same or like parts, and its detailed description is omitted herein. The difference between the embodiment shown in FIG. 3A to FIG. 3D and the embodiment shown in FIG. 1A to FIG. 1H is that a second conductive shielding structure 122 is further formed. The same steps as described from FIG. 1A to FIG. 1D may be performed to form a first trench TR1 within the insulating encapsulant 110 that surrounds the first semiconductor chip 108A. In some embodiments, portions of the insulating encapsulant 110 are removed to form the trench TR1, and the trench TR1 is a continuous ring-shaped trench surrounding the first semiconductor chip 108A without exposing the first semiconductor chip 108A. In certain embodiments, the trench TR1 exposes a first surface X1 of the first conductive plate 106A. In some embodiments, as shown in FIG. 3A, a second trench TR2 is also formed within the insulating encapsulant 110 that surrounds the second semiconductor chip 108B. In certain embodiments, the trench TR2 is a continuous ring-shaped trench encircling the second semiconductor chip 108B without exposing the first semiconductor chip 108B. In certain embodiments, the second trench TR2 exposes a second surface X2 of the second conductive plate 106B. In some embodiments, portions (other than the portions removed to form the trench TR1) of the insulating encapsulant 110 are removed to form the second trench TR2 that surrounds the second semiconductor chip 108B. In some embodiments, the second trench TR2 is for example, formed by a laser drilling process.

Figure 3B:
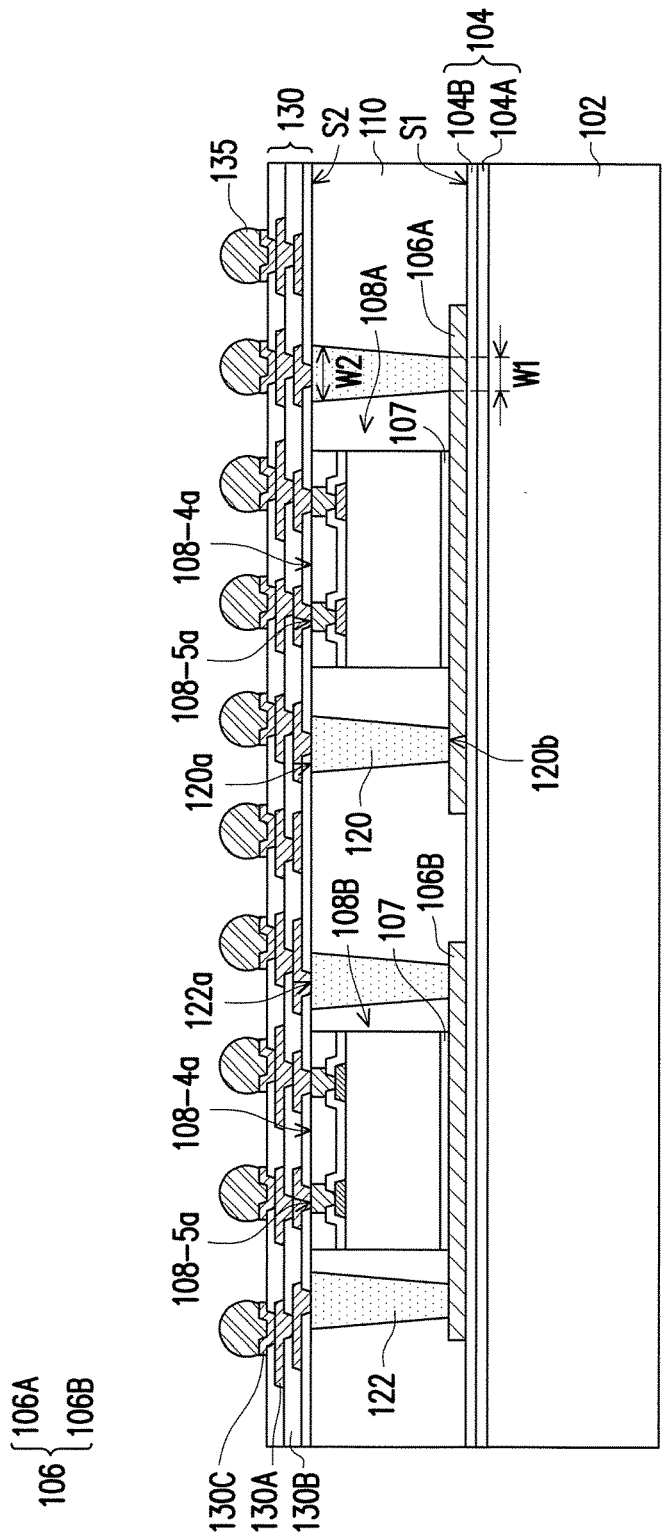

Referring to FIG. 3B, after forming the trench TR1 and the second trench TR2, the trench TR1 and the second trench TR2 are filled with a conductive paste (not shown), and the conductive paste is cured to form a conductive shielding structure 120 within the first trench TR1 and a second conductive shielding structure 122 within the second trench TR2 respectively. In the exemplary embodiment, the conductive shielding structure 120 is a solid and continuous ring-like structure that surrounds the semiconductor chip 108A, but not limited thereto. In some embodiments, the second conductive shielding structure 122 is a solid and continuous ring-like structure that surrounds the second semiconductor chip 108B, but not limited thereto.

In some alternative embodiments, instead of forming the trench TR2, separate via openings may be formed in the insulating encapsulant 110 around the second semiconductor chip 108B. In such alternative embodiments, a plurality of through insulator vias (not shown) may be formed by filling the conductive paste into the via openings and curing the conductive paste, whereby the through insulator vias are located penetrating the insulating encapsulant 110 and are separated from one another.

In some embodiments, after forming the conductive shielding structure 120 and the second conductive shielding structure 122, the insulating encapsulant 110 is thinned until top surfaces of the first semiconductor chip 108A and the second semiconductor chip 108B are exposed. For example, the top surface 108-4a of the protection layer 108-4 and the top surface 108-5a of the conductive pillars 108-5 of the semiconductor chips (108A/108B) are exposed from the insulating encapsulant 110 after the thinning process. The conductive shielding structure 120 and the second conductive shielding structure 122 are partially thinned as well so that their respective top surface 120a and 122a are coplanar with the second surface S2 of the insulating encapsulant 110. In certain embodiments, after the thinning process, the conductive shielding structure 120 surrounds the first semiconductor chip 108A while the second conductive shielding structure 122 surrounds the second semiconductor chip 108B. In the next step, the redistribution layer 130 and conductive balls 135 may be formed on the first semiconductor chip 108A, the second semiconductor chip 108B, the conductive shielding structure 120, the second conductive shielding structure 122, and on the insulating encapsulant 110. The redistribution layer 130 and conductive balls 135 may be formed by referring to the steps described in FIG. 1F, hence will not be repeated herein.

Figure 3C:
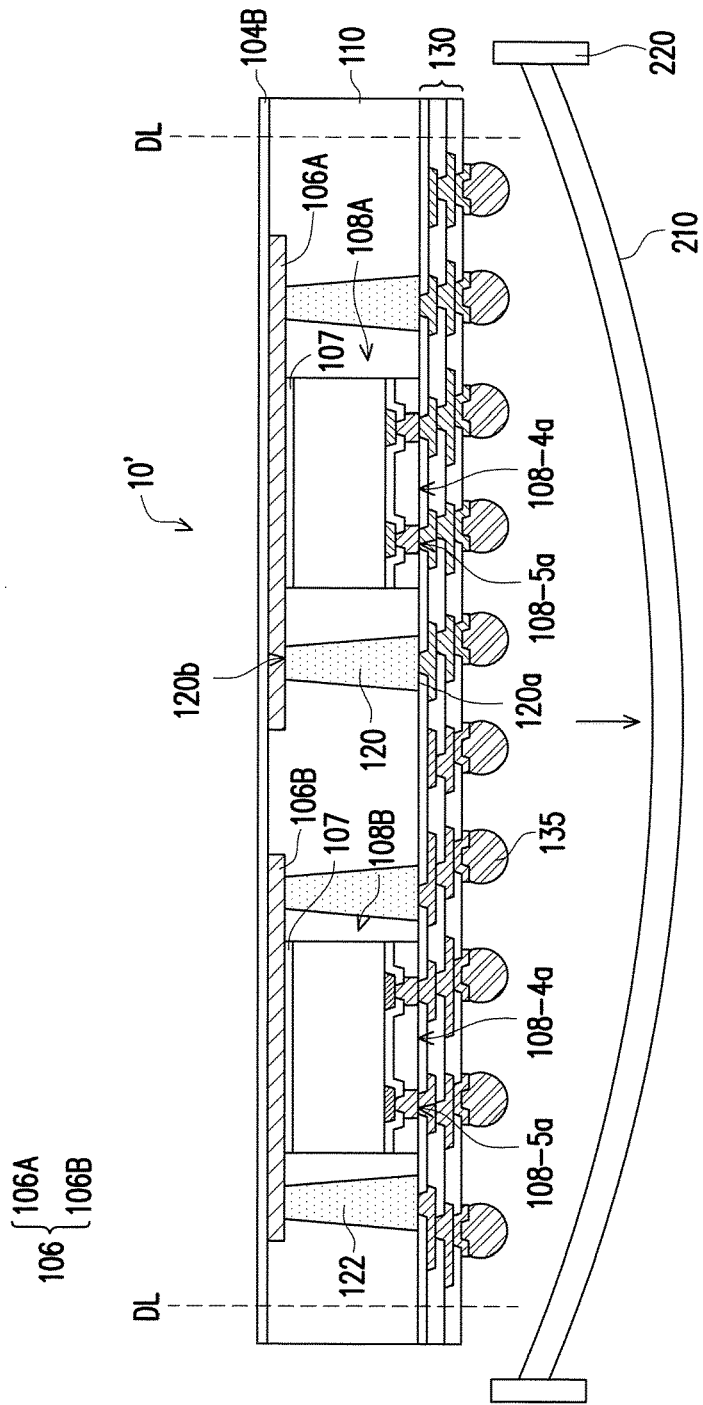
Figure 3D:
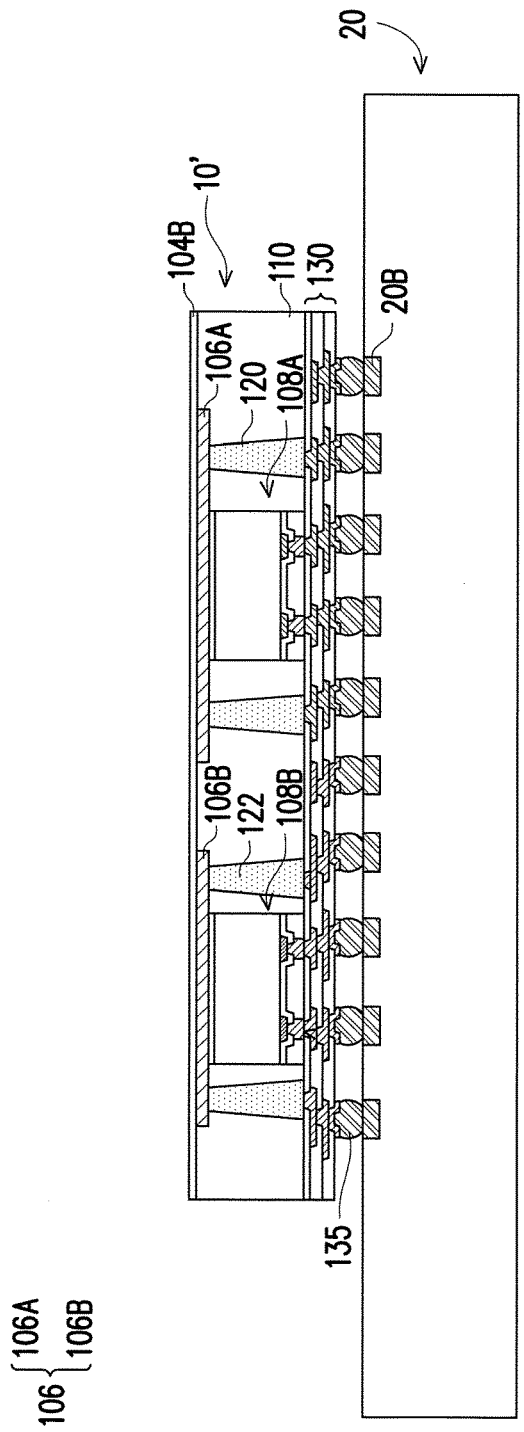

Referring to FIG. 3C, the structure shown in FIG. 3B is turned upside down and attached to a tape 210 (e.g., a dicing tape 210) supported by a frame 220. In the exemplary embodiment, the carrier 102 is debonded, and a dicing process is performed along the dicing line DL to cut the whole wafer structure (cutting through the dielectric layer 104B, the insulating encapsulant 110 and the redistribution layer 130) into a plurality of packages 10'. The same debonding and dicing process described in FIG. 1H may be performed. Subsequently, the separated packages 10' may be disposed onto a circuit substrate 20 as illustrated in FIG. 3D. For example, the package 10' may be electrically connected to bonding pads 20B of the circuit substrate 20 through the plurality of conductive balls 135.

Figure 4:
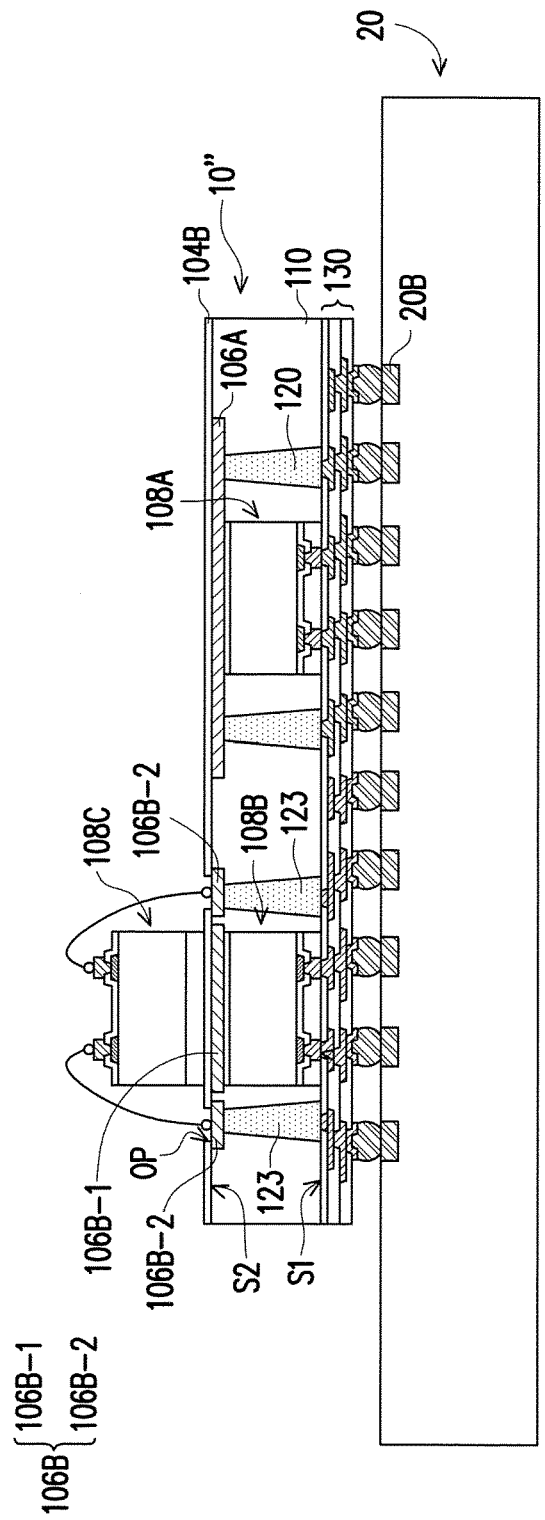
FIG. 4 is a schematic sectional view of a package structure according to some other exemplary embodiments of the present disclosure.

FIG. 4 is a schematic sectional view of a package structure according to some other exemplary embodiments of the present disclosure. Referring to FIG. 4, the package 10" may be formed by a similar method described in FIG. 3A to FIG. 3D, hence the same reference numerals are used to refer to the same or like parts and its detailed description will be omitted herein. The main differences between the package 10" of FIG. 4 and the package 10' of FIG. 3A to FIG. 3D lie in that plural through insulator vias 123 are formed instead of the second conductive shielding structure 122, and that a third semiconductor chip 108C is provided.

In the exemplary embodiment, the plurality of through insulator vias 123 is sandwiched in between the conductive pattern 106 and the redistribution layer 130, wherein the plurality of through insulator vias 123 surrounds the second semiconductor chip 108B and electrically connects the conductive pattern 106 with the redistribution layer 130. In some embodiments, the plurality of through insulator vias 123 are formed by filling the conductive paste into the via openings and are formed together with the conductive shielding structure 120. In certain embodiments, the through insulator vias 123 and the conductive shielding structure 120 are made of the same material. In certain embodiments, the material of the through insulator vias 123 comprises silver and copper. In some embodiments, the plurality of through insulator vias 123 for example, are separated from one another. In certain embodiments, the second conductive plate 106B of the conductive pattern 106 may include a first portion 106B-1 and a second portion 106B-2. The second semiconductor chip 108B is disposed on the first portion 106B-1 of the second conductive plate 106B while the plurality of through insulator vias 123 is disposed on the second portion 106B-2 of the second conductive plate 106B.

In some embodiments, after debonding the carrier 102, openings OP are formed in the dielectric layer 104B to expose the conductive pattern 106, or to expose the second portion 106B-2 of the second conductive plate 106B. Subsequently, the third semiconductor chip 108C is disposed on the insulating encapsulant 110 opposite to a side where the redistribution layer 130 is located. That is, in some embodiments, the third semiconductor chip 108C is disposed on the second surface S2 of the insulating encapsulant 110, and is disposed above the second semiconductor chip 108B. In certain embodiments, the third semiconductor chip 108C may be electrically connected to the exposed conductive patterns 106 (the second portion 106B-2 of the second conductive plate 106B) through wire bonding. In addition, the third semiconductor chip 108C may be the same or different as the first semiconductor chip 108A and the second semiconductor chip 108B. In some embodiments, the third semiconductor chip 108C is for example, a memory chip.

Figure 5:
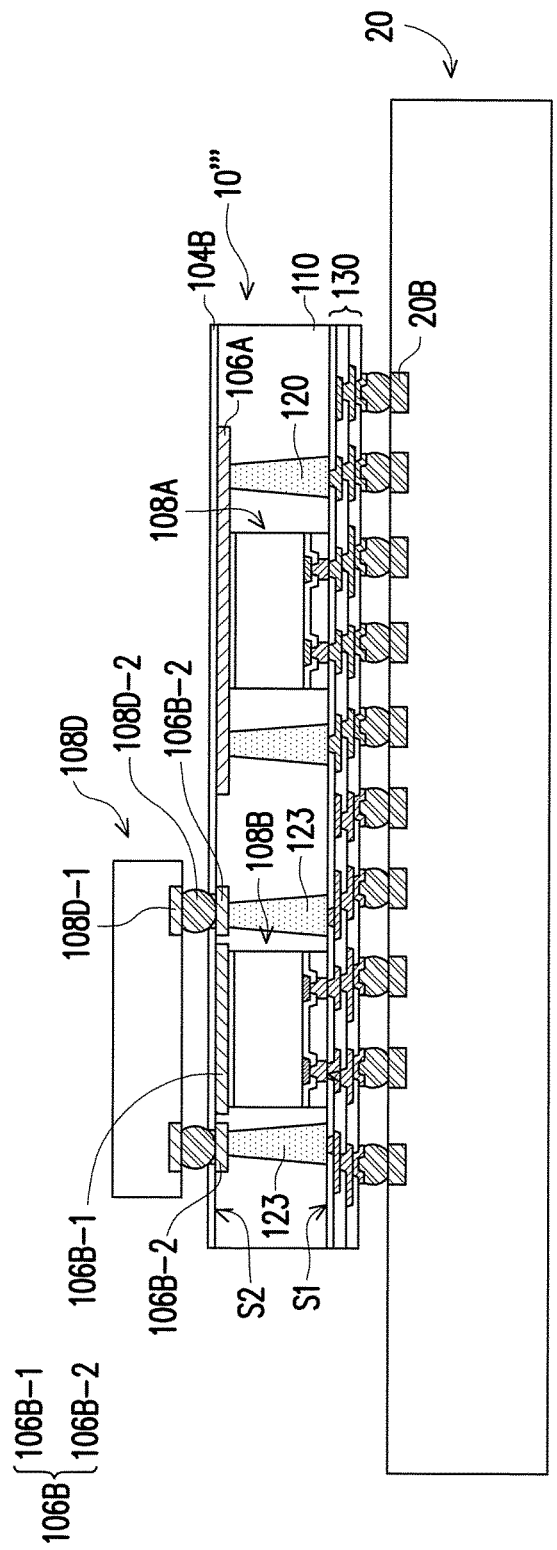
FIG. 5 is a schematic sectional view of a package structure according to some other exemplary embodiments of the present disclosure.

FIG. 5 is a schematic sectional view of a package structure according to some other exemplary embodiments of the present disclosure. Referring to FIG. 5, the package 10''' may be formed by a similar method to the package 10'' shown in FIG. 4, hence the same reference numerals are used to refer to the same or like parts and its detailed description will be omitted herein. The main differences between the package 10''' of FIG. 5 and the package 10'' of FIG. 4 is that a third semiconductor chip 108D is electrically connected to the exposed conductive patterns 106 through conductive elements 108D-2 (e.g. conductive balls) instead of using wire bonding. Referring to FIG. 5, in some embodiments, the third semiconductor chip 108D include bonding pads 108D-1 with conductive elements 108D-2 disposed on the bonding pads 108D-2. The conductive elements 108D-2 are, for example, solder balls or ball grid array (BGA) balls. In certain embodiments, the third semiconductor chip 108D is electrically connected to the second portion 106B-2 of the second conductive plate 106B and the through insulator vias 123 through the bonding pads 108D-1 and conductive elements 108D-2. In addition, the third semiconductor chip 108D may be the same or different as the first semiconductor chip 108A and the second semiconductor chip 108B. In some embodiments, the third semiconductor chip 108D is for example, a DRAM chip or a cache memory chip.

In the above-mentioned embodiments, the conductive pattern (conductive plates) may function as heatsinks. Furthermore, by forming the conductive shielding structure to surround the semiconductor chips, a high shielding capability can be obtained. As such, the distance between adjacent semiconductor chips can be made closer as compared to conventional structures. For example, in one embodiment, when radio frequency chips are used, the conductive shielding structure may act to shield the electromagnetic interference or filter out the signal noise from the radio frequency chips. Overall, a smaller package size and better system performance may be achieved due to the closer arrangements and shorter interconnection between circuits. Additionally, the manufacturing cost may be reduced due to the smaller package size.

In accordance with some embodiments of the present disclosure, a package structure including at least one conductive plate, a redistribution layer, a first semiconductor chip, a conductive shielding structure and an insulating encapsulant is provided. The first semiconductor chip is sandwiched in between the at least one conductive plate and the redistribution layer, wherein the first semiconductor chip is disposed on the at least one conductive plate and electrically connected to the redistribution layer. The conductive shielding structure is sandwiched in between the at least one conductive plate and the redistribution layer, wherein the conductive shielding structure surrounds the first semiconductor chip and electrically connects the at least one conductive plate with the redistribution layer. The insulating encapsulant is disposed on the redistribution layer, encapsulating the first semiconductor chip, the conductive shielding structure, and surrounding the at least one conductive plate.

In accordance with another embodiment of the present disclosure, a package structure including a conductive pattern, a redistribution layer, a first semiconductor chip, a second semiconductor chip, a conductive shielding structure, a plurality of through insulator vias and an insulating encapsulant is provided. The first semiconductor chip is sandwiched in between the conductive pattern and the redistribution layer, wherein the first semiconductor chip is disposed on the conductive pattern and electrically connected to the redistribution layer. The second semiconductor chip is sandwiched in between the conductive pattern and the redistribution layer, wherein the second semiconductor chip is disposed beside the first semiconductor chip. The conductive shielding structure is sandwiched in between the conductive pattern and the redistribution layer, wherein the first semiconductor chip is encircled by the conductive shielding structure, and the conductive shielding structure electrically connects the conductive pattern with the redistribution layer. The plurality of through insulator vias is sandwiched in between the conductive pattern and the redistribution layer, wherein the plurality of through insulator vias surrounds the second semiconductor chip and electrically connects the conductive pattern with the redistribution layer. The insulating encapsulant is disposed on the redistribution layer, and encapsulating the first semiconductor chip, the second semiconductor chip, the conductive shielding structure, the plurality of through insulator vias, and surrounding the conductive pattern.

In accordance with yet another embodiment of the present disclosure, a method of fabricating a package structure is described. The method of fabricating the package structure includes the following steps. A carrier is provided, and at least one metal plate is formed on the carrier. A first semiconductor chip is disposed on the at least one metal plate. An insulating encapsulant is formed on the carrier to cover the at least one metal plate and to encapsulate the first semiconductor chip. A first trench is formed in the insulating encapsulant to expose portions of the at least one metal plate. The first trench is filled with a conductive paste to form a conductive shielding structure within the first trench to cover the exposed portions of the at least one metal plate, wherein the conductive shielding structure surrounds the first semiconductor chip. A redistribution layer is formed on the first semiconductor chip, the conductive shielding structure and the insulating encapsulant, wherein the at least one metal plate and the conducive shielding structure are electrically connected with the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   at least one conductive plate;
   a redistribution layer;
   a first semiconductor chip sandwiched in between the at least one conductive plate and the redistribution layer, wherein the first semiconductor chip is disposed on the at least one conductive plate and electrically connected to the redistribution layer;
   a conductive shielding structure sandwiched in between the at least one conductive plate and the redistribution layer, wherein the conductive shielding structure surrounds the first semiconductor chip and electrically connects the at least one conductive plate with the redistribution layer; and
   an insulating encapsulant, disposed on the redistribution layer, encapsulating the first semiconductor chip, the conductive shielding structure, and surrounding the at least one conductive plate.

2. The package structure according to claim 1, further comprising:
   a second semiconductor chip sandwiched in between a second conductive plate and the redistribution layer, wherein the second semiconductor chip is disposed beside the first semiconductor chip, and the insulating encapsulant encapsulates the second semiconductor chip and surrounds the second conductive plate.

3. The package structure according to claim 2, further comprising:
   a second conductive shielding structure sandwiched in between the second conductive plate and the redistribution layer, wherein the second conductive shielding structure surrounds the second semiconductor chip and electrically connects the second conductive plate with the redistribution layer.

4. The package structure according to claim 2, wherein the first semiconductor chip is a radio frequency chip, and the second semiconductor chip is an application processor chip or a base band chip.

5. The package structure according to claim 1, wherein a material of the conductive shielding structure comprises copper and silver.

6. The package structure according to claim 1, wherein a width of the conductive shielding structure is in a range of 40 μm to 250 μm.

7. The package structure according to claim 1, wherein the at least one conductive plate functions as a heatsink.

8. A package structure, comprising:
   a conductive pattern;
   a redistribution layer;
   a first semiconductor chip sandwiched in between the conductive pattern and the redistribution layer, wherein the first semiconductor chip is disposed on the conductive pattern and electrically connected to the redistribution layer;
   a second semiconductor chip sandwiched in between the conductive pattern and the redistribution layer, wherein the second semiconductor chip is disposed beside the first semiconductor chip;
   a conductive shielding structure sandwiched in between the conductive pattern and the redistribution layer, wherein the first semiconductor chip is encircled by the conductive shielding structure, and the conductive shielding structure electrically connects the conductive pattern with the redistribution layer;
   a plurality of through insulator vias sandwiched in between the conductive pattern and the redistribution layer, wherein the plurality of through insulator vias surrounds the second semiconductor chip and electrically connects the conductive pattern with the redistribution layer; and
   an insulating encapsulant, disposed on the redistribution layer, encapsulating the first semiconductor chip, the second semiconductor chip, the conductive shielding structure, the plurality of through insulator vias, and surrounding the conductive pattern.

9. The package structure according to claim 8, wherein the conductive pattern comprises a first conductive plate and a second conductive plate, the first semiconductor chip is disposed on the first conductive plate and the second semiconductor chip is disposed on the second conductive plate.

10. The package structure according to claim 9, further comprising:
    a dielectric layer disposed on the conductive pattern and the insulating encapsulant, wherein the second conductive plate comprises a first portion and a second portion, the second semiconductor chip is disposed on the first portion of the second conductive plate and the plurality of through insulator vias is disposed on the second portion of the second conductive plate, and the dielectric layer has openings that expose the second portion of the second conductive plate; and
    a third semiconductor chip disposed on the dielectric layer and on the second semiconductor chip, wherein the third semiconductor chip is connected to the second portion of the second conductive plate.

11. The package structure according to claim 8, wherein a material of the conductive shielding structure comprises copper and silver.

12. The package structure according to claim 8, wherein a material of the plurality of through insulator vias comprises copper and silver.

13. The package structure according to claim 8, wherein a width of the conductive shielding structure is in a range of 40 μm to 250 μm.

14. A method of fabricating a package structure, comprising:
providing a carrier;
forming at least one metal plate on the carrier;
disposing a first semiconductor chip on the at least one metal plate;
forming an insulating encapsulant on the carrier to cover the at least one metal plate and to encapsulate the first semiconductor chip;
forming a first trench in the insulating encapsulant to expose portions of the at least one metal plate;
filling the first trench with a conductive paste to form a conductive shielding structure within the first trench to cover the exposed portions of the at least one metal plate, wherein the conductive shielding structure surrounds the first semiconductor chip; and
forming a redistribution layer on the first semiconductor chip, the conductive shielding structure and the insulating encapsulant, wherein the at least one metal plate and the conducive shielding structure are electrically connected with the redistribution layer.

15. The method according to claim 14, further comprising:
forming a second metal plate on the carrier; and
disposing a second semiconductor chip on the second metal plate, wherein the second semiconductor chip is disposed beside the first semiconductor chip, and the insulating encapsulant is formed to surround the second metal plate and to encapsulate the second semiconductor chip.

16. The method according to claim 15, further comprising:
forming a second trench in the insulating encapsulant to expose portions of the second metal plate; and
filling the second trench with the conductive paste to form a second conductive shielding structure within the second trench to cover the exposed portions of the second metal plate, wherein the second conductive shielding structure surrounds the second semiconductor chip.

17. The method according to claim 15, wherein the first semiconductor chip is a radio frequency chip, and the second semiconductor chip is an application processor chip or a base band chip.

18. The method according to claim 14, wherein the first trench is formed by performing a laser drilling process to remove portions of the insulating encapsulant.

19. The method according to claim 14, wherein filling the trench with a conductive paste further comprises curing the conductive paste to form the conductive shielding structure.

20. The method according to claim 14, wherein the conductive shielding structure comprises silver and copper.

* * * * *